(12) United States Patent
Nasuno et al.

(10) Patent No.: US 8,907,203 B2
(45) Date of Patent: Dec. 9, 2014

(54) INTEGRATED THIN-FILM SOLAR BATTERY

(75) Inventors: Yoshiyuki Nasuno, Osaka (JP); Tohru Takeda, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 493 days.

(21) Appl. No.: 13/061,210

(22) PCT Filed: Aug. 5, 2009

(86) PCT No.: PCT/JP2009/063869
§ 371 (c)(1),
(2), (4) Date: Feb. 28, 2011

(87) PCT Pub. No.: WO2010/026849
PCT Pub. Date: Mar. 11, 2010

(65) Prior Publication Data
US 2011/0146750 A1   Jun. 23, 2011

(30) Foreign Application Priority Data
Sep. 4, 2008   (JP) ................................ 2008-227071

(51) Int. Cl.
*H01L 31/042*   (2014.01)
*H01L 31/02*   (2006.01)
*H01L 27/142*   (2014.01)

(52) U.S. Cl.
CPC ........ *H01L 27/1423* (2013.01); *H01L 31/0201* (2013.01); *Y02E 10/50* (2013.01)
USPC .......................................... 136/244; 136/249

(58) Field of Classification Search
CPC .................... H01L 31/0201; H01L 27/1423
USPC .................................................. 136/244, 249
See application file for complete search history.

(56) References Cited

U.S. PATENT DOCUMENTS 6,288,323 B1 *   9/2001   Hayashi et al. ................ 136/244
6,455,347 B1     9/2002   Hiraishi et al.
6,469,242 B1    10/2002   Kondo (Continued)

FOREIGN PATENT DOCUMENTS

JP   60-100482   6/1985
JP   2000-49369  2/2000

(Continued)

OTHER PUBLICATIONS

JP2002-124690, Machine Translation, Fukuoka Apr. 2002.*

(Continued)

*Primary Examiner* — Devina Pillay
(74) *Attorney, Agent, or Firm* — Nixon & Vanderhye, P.C.

(57) ABSTRACT

An integrated thin-film solar battery is disclosed. The integrated thin film solar battery includes a plurality of series connected solar cell strings with one or more power collecting electrodes electrically joined to the string. The thin-film photoelectric conversion elements have a first transparent electrode layer and a second transparent electrode layer sandwiching a photoelectric conversion layer. The string has an element separating groove and the first electrode layer has an extending section having one end that crosses the element separating groove and extends to a region of an adjacent element. At least a portion of the first electrode layer just below the power collecting electrodes and another portion of the first electrode layer are insulated and separated from each other by at least one of an electrode separating line and an insulating line.

5 Claims, 6 Drawing Sheets

(56) References Cited

U.S. PATENT DOCUMENTS

| | | |
|---|---|---|
| 2006/0196536 A1 | 9/2006 | Fujioka et al. |
| 2008/0099063 A1* | 5/2008 | Armstrong et al. ........... 136/249 |
| 2011/0146749 A1 | 6/2011 | Nasuno et al. |
| 2011/0168237 A1 | 7/2011 | Takeda et al. |

FOREIGN PATENT DOCUMENTS

| | | |
|---|---|---|
| JP | 2001-68713 | 3/2001 |
| JP | 2001-77385 | 3/2001 |
| JP | 2001-135836 | 5/2001 |
| JP | 2002-124690 | 4/2002 |
| JP | 2005-353767 | 12/2005 |
| JP | 2006-245507 | 9/2006 |
| JP | 2008-109041 | 5/2008 |

OTHER PUBLICATIONS

Yamagishi, JP2000-049369 A, Machine Translation, Feb. 18, 2000.*
International Search Report for PCT/JP2009/063869, mailed Nov. 10, 2009.
Office Action issued in U.S. Appl. No. 13/061,204 dated Apr. 9, 2013.

* cited by examiner

US 8,907,203 B2

INTEGRATED THIN-FILM SOLAR BATTERY

This application is the U.S. national phase of International Application No. PCT/JP2009/063869 filed 5 Aug. 2009, which designated the U.S., and claims priority to Japan Application No. 2008-227071 filed 4 Sep. 2008, the entire contents of each of which are hereby incorporated by reference.

TECHNICAL FIELD

The present invention relates to an integrated thin-film solar battery.

BACKGROUND ART

As a conventional technique 1, for example, FIG. 6 in Patent Document 1 discloses an integrated thin-film solar battery having a string where a plurality of thin-film photoelectric conversion elements are electrically connected in series.

In the conventional technique 1, the thin-film photoelectric conversion elements are configured so that a transparent electrode layer, a photoelectric conversion layer and a metal electrode layer are sequentially laminated on a transparent insulating substrate, and a power collecting electrode made of a metal bar is jointed onto three or more places of the metal electrode layer of the thin-film photoelectric conversion elements via a brazing filler metal.

Further, as an integrated thin-film solar battery in a conventional technique 2, FIG. 1 of Patent Document 1 discloses an integrated thin-film solar battery having the following constitution.

In this constitution, in thin-film photoelectric conversion elements that joint power collecting electrodes, metal electrode layer and photoelectric conversion layer are partially removed so that grooves are formed, and the power collecting electrodes are buried into the grooves so as to be electrically connected to the transparent electrode layer directly.

This constitution is also disclosed in FIG. 1 of Patent Document 2.

In the integrated thin-film solar batteries in the conventional techniques 1 and 2 where the power collecting electrodes are jointed to the three or more thin-film photoelectric conversion elements, the plurality of thin-film photoelectric conversion elements between the power collecting electrode on one end side and the intermediate power collecting electrode are connected in series so as to form one series-connected string. Further, the series-connected strings adjacent in a series-connecting direction are constituted so that their current directions are opposite to each other.

Further, as a conventional technique 3, FIG. 1 in Patent Document 3 discloses an integrated thin-film solar battery having a constitution such that a power collecting electrode is jointed to only a metal electrode layer of thin-film photoelectric conversion elements on both ends in the serial-connecting direction.

Further, as a conventional technique 4, FIG. 3 in Patent Document 3 discloses an integrated thin-film solar battery having a constitution such that a power collecting electrode is jointed to a metal electrode layer of thin-film photoelectric conversion elements on both ends in a serial-connecting direction and a metal electrode layer of one or more thin-film photoelectric conversion elements between the thin-film photoelectric conversion elements on the both ends.

PRIOR ART DOCUMENTS

Patent Documents

Patent Document 1: Japanese Patent Application Laid-Open No. 2005-353767
Patent Document 2: Japanese Patent Application Laid-Open No. 2000-49369
Patent Document 3: Japanese Patent Application Laid-Open No. 2001-68713

DISCLOSURE OF THE INVENTION

Problem to be Solved by the Invention

In the integrated thin-film solar battery of the conventional technique 1, when the power collecting electrode is jointed onto the metal electrode layer of the thin-film photoelectric conversion element via the brazing filler metal, since a film thickness of the thin-film photoelectric conversion elements is 200 to 5000 nm that is thin, the photoelectric conversion layer between the metal electrode layer and the transparent electrode layer is occasionally short-circuited halfway due to a pressure generated by pressing the power collecting electrode onto a surface of the metal electrode layer.

In this case, since the photoelectric conversion layer just below the power collecting electrode has a normal photoelectric converting function, an electric power generated from the photoelectric conversion layer is consumed on the short-circuited portion so that a heat is locally generated. The local heat generation causes, for example, substrate cracking, film peeling, electrode damage and dropping of the power collecting electrode.

In addition to this case, since the photoelectric conversion layer just below the power collecting electrode is not sufficiently separated from another adjacent photoelectric conversion layer in the series-connecting direction, when the metal electrode layer of one thin-film photoelectric conversion element insufficiently contacts with the transparent electrode layer of another adjacent thin-film photoelectric conversion element, a large electric current flow intensively to the short-circuited places in the photoelectric conversion layer, thereby causing more heat generation.

The "short-circuit halfway" means that since a power resistance is larger than that in a normal electric short circuit (a range of the electric resistance: 10 to 1000Ω), and the heat generation occurs at the time when an electric current flow.

In a case of the conventional technique 2, since the power collecting electrode is formed on the transparent electrode layer, the problem of the short circuit like the conventional technique 1 does not arise.

In a case of the conventional technique 4 in which an intermediate power collecting electrode 114 is provided in the string having the element series-connected constitution, as shown in FIGS. 6 and 7, when a short-circuited portion is present in a photoelectric conversion layer 3 just below the intermediate power collecting electrode 114, also the photoelectric conversion layer 3 might generate a heat locally. In FIGS. 6 and 7, a symbol 101 represents a transparent insulating substrate, 102 represents a transparent electrode layer, 104 represents a metal electrode layer, 104a represents a conductive section for series connection, 105 represents a thin-film photoelectric conversion element, and 106 and 107 represent a power collecting electrode.

Means for Solving the Problem

It is an object of the present invention to provide an integrated thin-film solar battery that solves the problems of the conventional techniques and can prevent a local heat generation caused by shirt circuit in thin-film photoelectric elements.

Therefore, the present invention provides an integrated thin-film solar battery comprising:

a string including a plurality of thin-film photoelectric conversion elements that are formed on a transparent insulating substrate and are electrically connected in series to each other; and one or more power collecting electrodes electrically jointed to the string, wherein the thin-film photoelectric conversion elements have a first transparent electrode layer laminated on the transparent insulating substrate, a photoelectric conversion layer laminated on the first electrode layer and a second electrode layer laminated on the photoelectric conversion layer, the power collecting electrode is electrically connected onto the second electrode layer of any thin-film photoelectric conversion element in the string, the string has an element separating groove that is formed by removing the second electrode layer and the photoelectric conversion layer between the adjacent two thin-film photoelectric conversion elements, the first electrode layer of one thin-film photoelectric conversion element has an extended section whose one end crosses the element separating groove and that extends to a region of another adjacent thin-film photoelectric conversion element, and is electrically insulated from the first electrode layer of the adjacent thin-film photoelectric conversion element by one or more electrode separating lines, the second electrode layer of one thin-film photoelectric conversion element is electrically connected to the extended section of the first electrode layer of adjacent thin-film photoelectric conversion element via a conductive section passing through the photoelectric conversion layer, in the thin-film photoelectric conversion elements jointed to the power collecting electrode, at least a portion of the first electrode layer just below the power collecting electrode and the other portion are insulated and separated from each other by at least one of the electrode separating line and the insulating line.

Effect of the Invention

In the integrated thin-film solar battery of the present invention, as described above, at least the portion of the first electrode layer just below the power collecting electrode and the other portion are insulated and separated from each other by at least one of the electrode separating line and the insulating line in the thin-film photoelectric conversion elements jointed to the power collecting electrode.

Therefore, even when a halfway short circuit occurs in the photoelectric conversion layer just below the power collecting electrode due to a pressure or a heat generated at the time of jointing the power collecting electrode onto any thin-film photoelectric conversion element of the string, the portion of the first electrode layer just below the power collecting electrode is insulated and separated from the other portion, and thus an electric current does not flow. As a result, a local heat generation on a short-circuited portion is prevented.

Therefore, the integrated thin-film solar battery of the present invention can prevent occurrences of substrate cracking, film peeling, electrode damage and dropping of the power collecting electrode.

BEST MODE FOR CARRYING OUT THE INVENTION

In the present invention, a material, a number and a joint position of the power collecting electrode, a material, a number and a forming position of the conductive section, a number, a shape, a dimension and a material of the thin-film photoelectric conversion element configuring the string, a number and an arrangement of the string, an electric connecting method of a plurality of the strings and the like are not particularly limited.

Embodiments of an integrated thin-film solar battery of the present invention are described in detail below with reference to the drawings. The modes are examples of the present invention, and the present invention is not limited to the embodiments.

Embodiment 1

Figure 1:
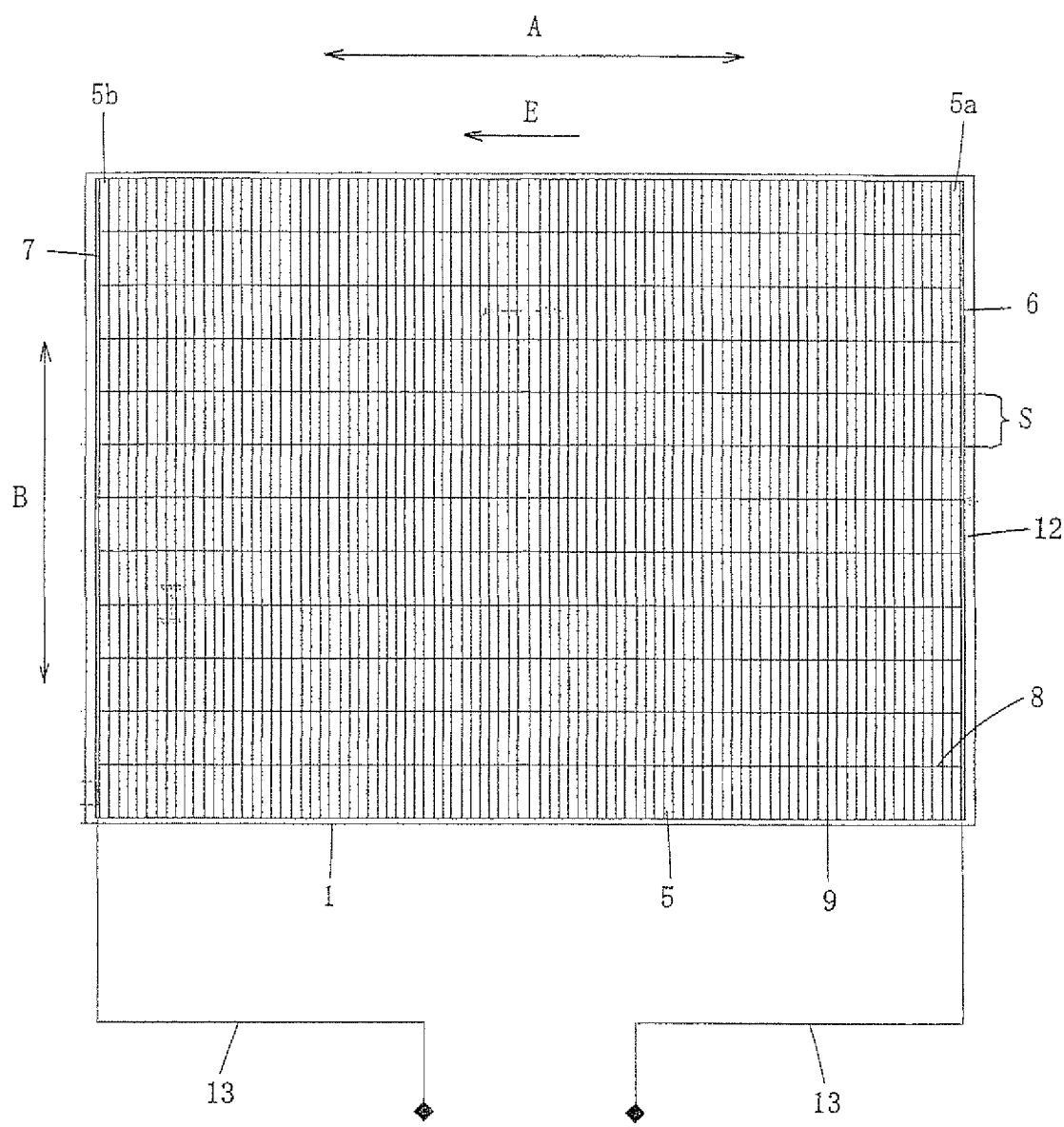
FIG. 1 is a plan view illustrating an integrated thin-film solar battery according to an embodiment 1 of the present invention.
Figure 2A:
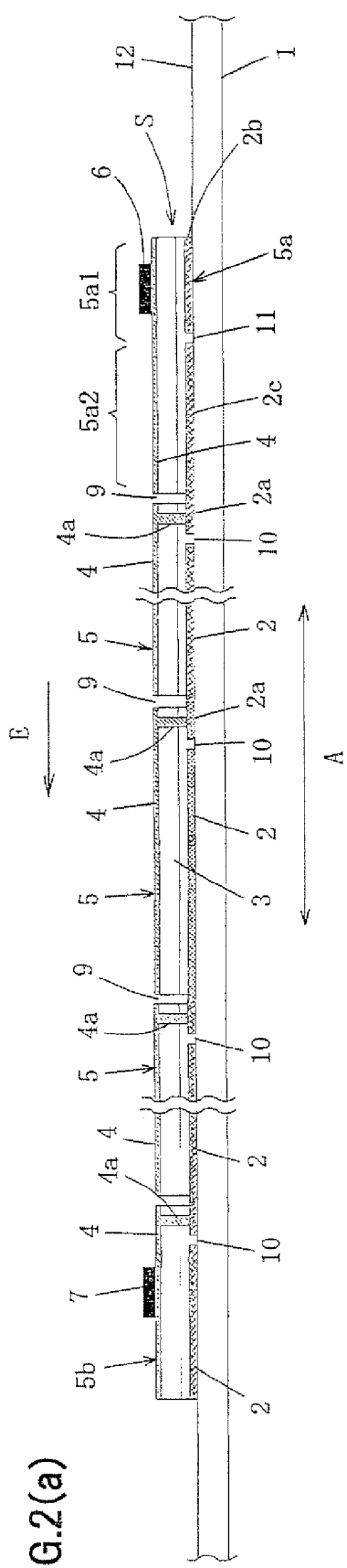
FIG. 2(a) is a cross-sectional view where the integrated thin-film solar battery in FIG. 1 is cut in a series-connecting direction.
Figure 2B:
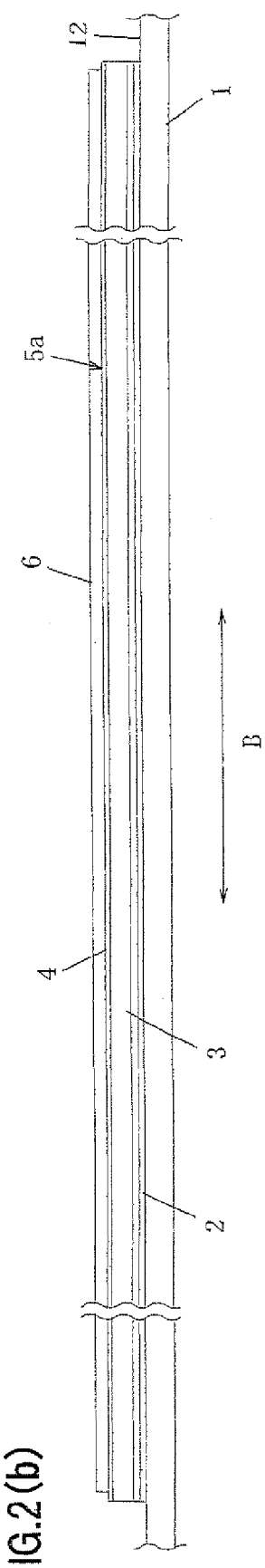
FIG. 2(b) is a side view of the integrated thin-film solar battery in FIG. 1 viewed from the series-connecting direction.
Figure 2C:
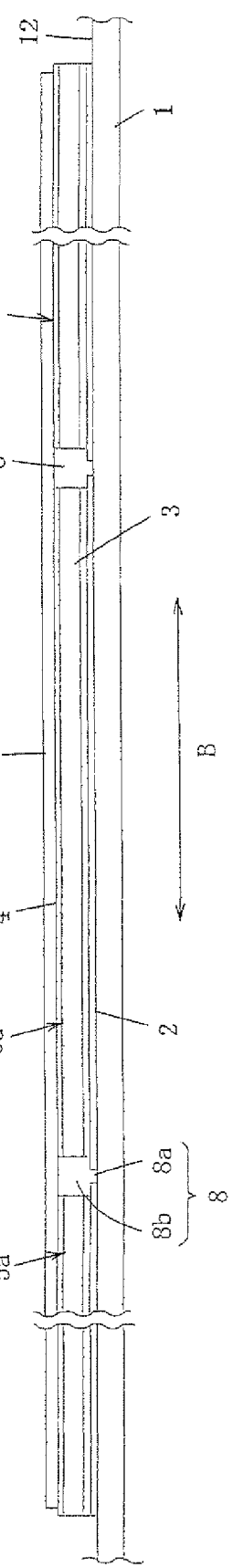
FIG. 2(c) is a side view of a modified example of the integrated thin-film solar battery in FIG. 1 viewed from the series-connecting direction.

FIG. 1 is a plan view illustrating the integrated thin-film solar battery according to an embodiment 1 of the present invention. FIG. 2(a) is a cross-sectional view where the integrated thin-film solar battery in FIG. 1 is cut in a series-connecting direction, FIG. 2(b) is a side view of the integrated thin-film solar battery in FIG. 1 viewed from the series-connecting direction, and FIG. 2(c) is a side view of a modified example of the integrated thin-film solar battery in FIG. 1 viewed from the series-connecting direction.

In FIGS. 1 and 2(a), an arrow E represents a flowing direction of an electric current (current direction), and when simple description of "an upper stream" or "a lower stream" in this specification means an upper stream or a lower stream in the current direction.

In FIGS. 1 and 2(a), an arrow A represents the series-connecting direction, and means a direction where a plurality of thin-film photoelectric conversion elements that are connected in series is arranged.

In FIGS. 1 and 2(a), an arrow B represents a direction that is perpendicular to the series-connecting direction.

This integrated thin-film solar battery includes a square transparent insulating substrate 1, a string S including a plurality of thin-film photoelectric conversion elements 5 that are formed on the insulating substrate 1 and are electrically connected in series to each other, one first power collecting electrode 6 and one second power collecting electrode 7 that are electrically jointed onto a second electrode layer 4 of thin-film photoelectric conversion elements 5a and 5b on both ends of the series-connecting direction A in the string S via a brazing filler metal.

The thin-film photoelectric conversion elements 5 are constituted so that the transparent first electrode layer 2, the photoelectric conversion layer 3 and the second electrode layer 4 are laminated on the insulating substrate 1 in this order.

As the first and second power collecting electrodes 6 and 7, for example, a copper line, a solder plating copper line or the like is used.

Further, in this solar battery, a plurality of the strings S (in this case, 12) are arranged on the insulating substrate 1 in the direction B perpendicular to the series-connecting direction via a plurality of string separating grooves 8 (in this case, 11) extending to the series-connecting direction A.

Hereinafter, in some cases, "the integrated thin-film solar battery" is abbreviated as "the solar battery", and "the thin-film photoelectric conversion element" is abbreviated as "the cell".

<String>

As shown in FIGS. 1 and 2(a), the string S has an element separating groove 9 that is formed by removing the second electrode layer 4 and the photoelectric conversion layer 3 between the adjacent two cells (thin-film photoelectric conversion elements) 5. This element separating groove 9 extends to the arrow direction B so that the second electrode 4 and the photoelectric conversion layer 3 of the one cell 5 are electrically separated from the second electrode 4 and the photoelectric conversion layer 3 of the adjacent another cell 5.

In this string S, the first electrode layer 2 of the one cell 5 has an extending section 2a whose one end (a lower-stream side end in the current direction E) crosses the element separating groove 9 and that extends to a region of adjacent another cell 5, and is electrically insulated from the adjacent first electrode layer 2 by an electrode separating line 10.

Further, one end (upper-stream side end in the current direction E) of the second electrode layer 4 of the one cell 5 is electrically connected to the extending section 2a of the first electrode layer 2 of the adjacent cell 5 via a conductive section 4a for connecting in series piercing the photoelectric conversion layer 3. The conductive section 4a can be formed integrally with the second electrode layer 4 by the same step and the same material.

Further, in the cell 5a jointed to the first power collecting electrode 6 and the cell 5b jointed to the second power collecting electrode 7 of the string S, the portion of the first electrode layer 2 just below the power collecting electrode is insulated and separated from the other portion.

Concretely as shown in FIG. 2(a), the cell 5a jointed to the first power collecting electrode 6 has a first portion 5a1 just below and near the first power collecting electrode 6, and a second portion 5a2 on the lower-stream side in the current direction E with respect to the first portion 5a1. A section 2b of the first electrode layer 2 just below and near the first power collecting electrode 6 (namely, the first electrode layer 2b of the first portion 5a1) is electrically insulated and separated from the other portion 2c of the first electrode layer (namely, a first electrode layer 2c of the second portion 5a2) by an insulating line 11 formed on the lower-stream side in the current direction E.

Further, since another cell is not arranged on the upper-stream side of the cell 5a in the current direction E, the cell 5a does not have the electrode separating line 10 for electrically insulating from the first electrode layer on the other cells on the upper-stream side, but no presence of the other cells on the upper-stream side functions as the electrode separating line.

In such a manner, in the cell 5a on an uppermost-stream position jointed to the first power collecting electrode 6, at least the first electrode layer 2b just below the first power collecting electrode 6 is electrically insulated and separated from the first electrode layer 2c on the lower-stream side. For this reason, an electric current at the time of generating a power from the solar battery flow from the first power collecting electrode 6 not to the cell 5a1 but to the cell 5a2, and thus flow from the first electrode layer 2c to the cell 5 on the lower-stream side via a conductive section 4a.

Therefore, even when a halfway short circuit occurs in the photoelectric conversion layer 3 just below the first power collecting electrode 6 in the cell 5a, an electric current does not flow to the first portion 5a1 having the short-circuited portion. For this reason, a local heat generation on the short-circuited portion is prevented, thereby preventing dropping of the first power collecting electrode 6, substrate cracking, film peeling, and electrode damage, which are caused by the heat generation.

On the other hand, the cell 5b jointed to the second power collecting electrode 7 has the electrode separating line 10 on the upper-stream side in the current direction E with respect to the second power collecting electrode 7. Further, the other cells are not arranged on the lower-stream side in the current direction E with respect to the cell 5b.

In the cell 5b on a lowermost-stream position jointed to the second power collecting electrode 7, at least the first electrode layer 2 just below the second power collecting electrode 7 is electrically insulated and separated from the first electrode layer 2 of the cell 5 on the upper-stream side. For this reason, an electric current from the cell 5 on the upper-stream side does not flow to the first electrode layer 2 of the cell 5b but to the second electrode layer 4 and the second power collecting electrode 7 via the conductive section 4a. That is to say, the cell 5b on the lowermost-stream position does not substantially contribute to the power generation, and thus the second electrode 4 of the cell 5b is used as an extraction electrode of the first electrode 2 of the adjacent cell 5.

Therefore, even when a halfway short circuit occurs in the photoelectric conversion layer 3 just below the second power collecting electrode 7 in the cell 5b, the electric current does not flow to the short-circuited portion. For this reason, a local heat generation on the short-circuited portion is prevented, thereby preventing dropping of the second power collecting electrode 7, substrate cracking, film peeling, and electrode damage, which are caused by the heat generation.

Further in the plurality of strings S, each cell 5a (at least the first portion 5a1) jointed to the first power collecting electrode 6 and each cell 5b jointed to the second power collecting electrode 7 may be connected integrally as shown in FIG. 2(b), or may be separated by a string separating groove 8 as shown in FIG. 2(c).

In a case of FIG. 2(b), the string separating groove 8 does not completely split the adjacent two strings S, and the cell 5a and the cell 5b on both ends in the direction of the arrow A (at least 5a1) extend long to the direction of the arrow B. For this reason, both ends of all the strings S are electrically connected in parallel to the first power collecting electrode 6 and the second power collecting electrode 7 via the common second electrode layer 4.

In a case of FIG. 2(c), the string separating groove 8 completely splits the adjacent two strings S, but all the strings S are electrically connected in parallel by the first and second power collecting electrodes 6 and 7.

The string separating groove 8 includes a first groove 8a formed by removing the first electrode layer 2 and a second groove 8b that is formed by removing the photoelectric conversion layer 3 and the second electrode layer 4 with a width wider than a width of the first groove 8a. This is preferable that the short circuit between the first electrode layer 2 and the second electrode layer 4 in each of the cells is prevented by the formation of the string separating grooves 8. This is described in detail later.

Further, the plurality of strings S are formed on an inner side with respect to an outer peripheral end surface (an end surface of four sides) of the transparent insulating substrate 1. That is to say, an outer peripheral region on the surface of the insulating substrate 1 is a non-conductive surface region 12 that is not formed with the first electrode layer 2, the photoelectric conversion layer 3 and the second electrode layer 4, and its width is set to a dimension range according to an output voltage from the solar battery.

[Transparent Insulating Substrate and First Electrode Layer]

As the transparent insulating substrate 1, a glass substrate, a resin substrate made of polyimide or the like each having a heat-resistant in a subsequent film forming process and transparency.

The first electrode layer 2 is made of a transparent conductive film, and preferably made of a transparent conductive film including a material containing ZnO or $SnO_2$. The material containing $SnO_2$ may be $SnO_2$ itself, or may be a mixture of $SnO_2$ and another oxide (for example, ITO as a mixture of $SnO_2$ and $In_2O_3$).

[Photoelectric Conversion Layer]

A material of each semiconductor layer configuring the photoelectric conversion layer 3 is not particularly limited, and each semiconductor layer includes, for example, a silicon semiconductor, a CIS ($CuInSe_2$) compound semiconductor, and a CIGS ($Cu(In, Ga)Se_2$) compound semiconductor.

A case where each semiconductor layer is made of the silicon semiconductor is described as an example below.

"The silicon semiconductor" means a semiconductor made of an amorphous silicon or a microcrystal silicon, or a semiconductor in which carbon, germanium or another impurity is added to an amorphous silicon or a microcrystal silicon (silicon carbide, silicon germanium or the like). Further, "the microcrystal silicon" means a silicon in a state of a mixed phase including a crystal silicon with a small grain size (about several dozens to several thousand Å) and an amorphous silicon. The microcrystal silicon is formed when a crystal silicon thin film is produced at a low temperature by using a nonequilibrium process such as a plasma CVD method.

The photoelectric conversion layer 3 is constituted so that a p-type semiconductor layer, an i-type semiconductor layer and an n-type semiconductor layer are laminated from the side of the first electrode 2. The i-type semiconductor layer may be omitted.

The p-type semiconductor layer is doped with p-type impurity atoms such as boron or aluminum, and the n-type semiconductor layer is doped with n-type impurity atoms such as phosphorus.

The i-type semiconductor layer may be a semiconductor layer that is completely undoped, and, may be a weak p-type or weak re-type semiconductor layer including a small amount of impurities that sufficiently has a photoelectric converting function.

In this specification, "the amorphous layer" and "the microcrystal layer" mean amorphous and microcrystal semiconductor layers, respectively.

Further, the photoelectric conversion layer 3 may be of a tandem type where a plurality of pin structures are laminated. The photoelectric conversion layer 3 may include, for example, an upper semiconductor layer where an a-Si:H p-layer, an a-Si:H i-layer and an a-SiH n-layer are laminated on the first electrode 2 in this order, and a lower semiconductor layer where a µc-Si:H p-layer, a µc-Si:H layer and a µc-Si:H n-layer are laminated on the upper semiconductor layer in this order.

Further, the pin structure may be the photoelectric conversion layer 3 having a three-layered structure including the upper semiconductor layer, a middle semiconductor layer and the lower semiconductor layer. For example, the three-layered structure may be such that an amorphous silicon (a-Si) is used for the upper and middle semiconductor layers, and a microcrystal silicon (µc-Si) is used for the lower semiconductor layer.

A combination of the material of the photoelectric conversion layer 3 and the laminated structure is not particularly limited.

In embodiments and examples of the present invention, a semiconductor layer positioned on a light incident side of the thin-film solar battery is the upper semiconductor layer, and a semiconductor layer positioned on a side opposite to the light incident side is the lower semiconductor layer. A straight line drawn in the photoelectric conversion layer 3 in FIGS. 2(a) to (c) shows a boundary between the upper semiconductor layer and the lower semiconductor layer.

[Second Electrode Layer]

A structure and a material of the second electrode layer 4 are not particularly limited, but in one example, the second electrode 4 has a laminated structure where a transparent conductive film and a metal film are laminated on the photoelectric conversion layer.

The transparent conductive film is made of ZnO, ITO, $SiO_2$ or the like. The metal film is made of metal such as silver or aluminum.

The second electrode layer 4 may be made of only a metal film of Ag or Al, but it is preferable that the transparent conductive film made of ZnO, ITO or $SnO_2$ is arranged on the side of the photoelectric conversion layer 3 because a reflection rate at which light unabsorbed by the photoelectric conversion layer 3 is reflected from the rear electrode layer 4 is improved, and the thin-film solar battery with high conversion efficiency can be obtained.

[Another Structure]

As not shown, but in this solar battery, a rear surface sealing material is laminated on the transparent insulating substrate 1 via an adhesive layer so as to completely cover the string S and a nonconductive surface region 8.

As the adhesive layer, for example, a sealing resin sheet made of ethylene-vinyl acetate copolymer (EVA) can be used.

As the rear surface sealing material, for example, a laminated film where an aluminum film is sandwiched by a PET film can be used.

Small holes for leading front ends of extraction lines to be connected to the respective power collecting electrodes to the outside are formed on the adhesive layer and the rear surface sealing material in advance.

A terminal box having output lines and terminals to be electrically connected to extraction lines 13 is mounted onto the rear surface sealing material.

Further, a frame (made of, for example, aluminum) is attached to an outer peripheral portion of the solar battery sealed by the rear surface sealing material and the adhesive layer.

<Method for Manufacturing the Integrated Thin-Film Solar Battery>

The integrated thin-film solar battery can be manufactured by a manufacturing method including:

a depositing step of forming a pre-division string, where the plurality of cells 5 obtained by laminating the first electrode layer 2, the photoelectric conversion layer 3 and the second electrode layer 4 on one surface of the transparent insulating substrate 1 in this order are electrically connected in series to each other;

a film removing step of removing portions of the cells formed on the outer periphery on one surface of the insulating substrate 1 and a predetermined portion of the pre-division string by means of a light beam and forming the nonconductive surface region 12 and the string separating grooves 8 so as to form a plurality of strings S; and a power collecting electrode jointing step of electrically jointing the first power collecting electrode 6 and the second power collecting electrode 7 onto at least the second electrode layer 4 of the cells 5a and 5b on the both ends in the series-connecting direction A on the plurality of strings S.

[Depositing Step]

At the depositing step, a transparent conductive film with a thickness of 600 to 1000 nm is formed on an entire surface of the transparent insulating substrate 1 by a CVD method, a sputtering method, a vapor deposition method or the like, and the transparent conductive film is partially removed by a light beam. Thus, a plurality of parallel electrode separating lines 10 that extends to the direction of the arrow B are formed, so that the first electrode layer 2 is formed into a predetermined pattern. At this time, a fundamental wave of a YAG laser (wavelength: 1064 nm) is emitted from a side of the transparent insulating substrate 1 so that the transparent conductive film is separated into a strip shape with a predetermined width, and the plurality of electrode separating lines 10 are formed at predetermined intervals, and one insulating line 11 is formed in cell-forming regions with conditions the same as those of the formation of the electrode separating lines 10.

Thereafter, the obtained substrate is ultrasonically cleaned by pure water, and the photoelectric conversion film is formed on the first electrode layer 2 by p-CVD so as to completely embed the electrode separating lines 10 and the insulating line 11. For example, an a-Si:H p-layer, an a-Si:H i-layer (film thickness: about 150 nm to 300 nm) and an a-Si:H n-layer are laminated on the first electrode 2 in this order so that the upper semiconductor layer is formed. A µc-Si—H p-layer, a µc-Si:H i-layer (film thickness: about 1.5 µm to 3 µm) and a µc-Si:H n-layer are laminated on the upper semiconductor layer in this order so that the lower semiconductor layer is formed.

Thereafter, the photoelectric conversion film having the tandem structure is partially removed by a light beam, and contact lines for forming the conductive sections 4a are formed, so that the photoelectric conversion layer 3 having a predetermined pattern is formed. At this time, a second harmonic of a YAG laser (wavelength: 532 nm) is emitted from the side of the transparent insulating substrate 1, so that the photoelectric conversion film is separated into a strip shape with a predetermined width. Instead of the second harmonic of the YAG laser, a second harmonic of a $YVO_4$ laser (wavelength: 532 nm) may be used as the laser.

A conductive film is formed on the photoelectric conversion layer 3 by the CVD, sputtering or vapor deposition method so as to completely embed the contact lines, and the conductive film and the photoelectric conversion layer 3 are partially removed by a light beam so that the element separating groove 9 and the second electrode layer 4 having a predetermined pattern are formed. As a result, the plurality of cells 5 on the transparent insulating substrate 1 are electrically connected in series by the conductive sections 4a, and the pre-division string having a structure is formed in which the electric current does not flow to the first electrode layer 2b, 2 jointed to the first and second power collecting electrode 6, 7 with respect to the portion just below the power collecting electrodes on the cells 5a, 5b on the uppermost-stream side and the lower-stream side (see FIG. 2(a)).

At this time, since the pre-division string is not yet split into a plurality of them, one cell extends long to the direction of the arrow B.

At this step, the conductive film can be provided with a two-layered structure including the transparent conductive film (ZnO, ITO, $SnO_2$ or the like) and the metal film (Ag, Al or the like). A film thickness of the transparent conductive film can be 10 to 200 nm, and a film thickness of the metal film can be 100 to 50 nm.

Further, in patterning of the second electrode layer 4, in order to avoid damage to the first electrode layer 2 due to a light beam, a second harmonic of an YAG laser or a second harmonic of the $YVO_4$ laser that has high permeability with respect to the first conductive layer 2 is emitted from the side of the transparent insulating substrate 1, and the conductive film is separated into a strip pattern with a predetermined width so that the element separating grooves 9 are formed. At this time, processing conditions are preferably selected so that the damage to the first electrode layer 2 is suppressed to minimum, and generation of a burr on a processed silver electrode on the second electrode layer 4 is suppressed.

[Film Removing Step]

After the depositing step, the first electrode layer 2, the photoelectric conversion layer 3 and the second electrode layer 4 as the thin-film photoelectric conversion element portions formed on the outer periphery on the surface of the transparent insulating substrate 1 are removed by a predetermined width of the inner side from the outer periphery end surface of the transparent insulating substrate 1 by using a fundamental wave of the YAG laser. As a result, the nonconductive surface region 12 is formed on the entire periphery of the transparent insulating substrate 1.

Further, after or before this step, in order to divide the pre-division string into a plurality of them, the cell portions to be divided portions are removed so that a plurality of string separating grooves 8 are formed.

At this time, the fundamental wave of the YAG laser (wavelength: 1064 nm) is emitted from the side of the transparent insulating substrate 1, and the first electrode layer 2, the photoelectric conversion layer 3 and the second electrode layer 4 are partially removed so that the first grooves 8a are formed. Thereafter, the second harmonic of the YAG laser or the second harmonic of the $YVO_4$ laser that have high permeability with respect to the first conductive layer 2 is emitted from the side of the transparent insulating substrate 1, and the photoelectric conversion layer 3 and the second electrode 4 are partially removed by a width wider than that of the first groove 8a. Second grooves 8b are formed so that the string separating grooves 8 can be formed.

When the second grooves 8b wider than the first grooves 8a are formed later, a conductive material that scatters due to the formation of the first grooves 8a and adheres to groove inner surfaces can be removed, so that the short-circuit between the first electrode layer 2 and the second electrode layer 4 can be avoided.

At the film removing step, plural rows of strings S surrounded by the nonconductive surface region 12 are formed. When the pre-division string is not divided, only a laser machining for forming the nonconductive surface region 12 is carried out at the film removing step.

[Power Collecting Electrode Jointing Step]

A brazing filler metal (for example, a silver paste) is applied onto the second electrode layer 4 on both ends of the series-connecting direction A in the strings S, the first and second power collecting electrodes 6 and 7 are press-bonded to the brazing filler metal and are then heated. The first and second power collecting electrodes 6 and 7 are electrically connected to the second electrode layer 4, so that an extraction section for an electric current is formed. At this time, as a pressure is, for example, about 60 N, and a heat energy of the heating is, for example, about 30° C. However, since the cells 5a and 5b are thin, the short-circuit portion is occasionally formed on the portions just below the first and the second power collecting electrodes 6 and 7.

Thereafter, the extraction lines 13 are brazed to predetermined portions of the first and second power collecting electrodes 6 and 7.

[Other Steps]

A transparent EVA sheet as adhesive layer and a rear surface sealing material are laminated on the rear surface (non-light receiving surface) of the solar battery, and the rear surface sealing material is bonded to the solar battery via the adhesive layer and is sealed by using a vacuum laminating device. At this time, as the rear surface sealing material, a laminated film where an Al film is sandwiched by PET films is preferably used.

Thereafter, the extraction lines 13 are electrically connected to the output lines of the terminal box, the terminal box is bonded to the rear surface sealing material, and the terminal box is filled with a silicone resin. A metal frame (for example, an aluminum frame) is attached to the outer periphery of the thin-film solar battery, so that a product is finished.

Embodiment 2

Figure 3:
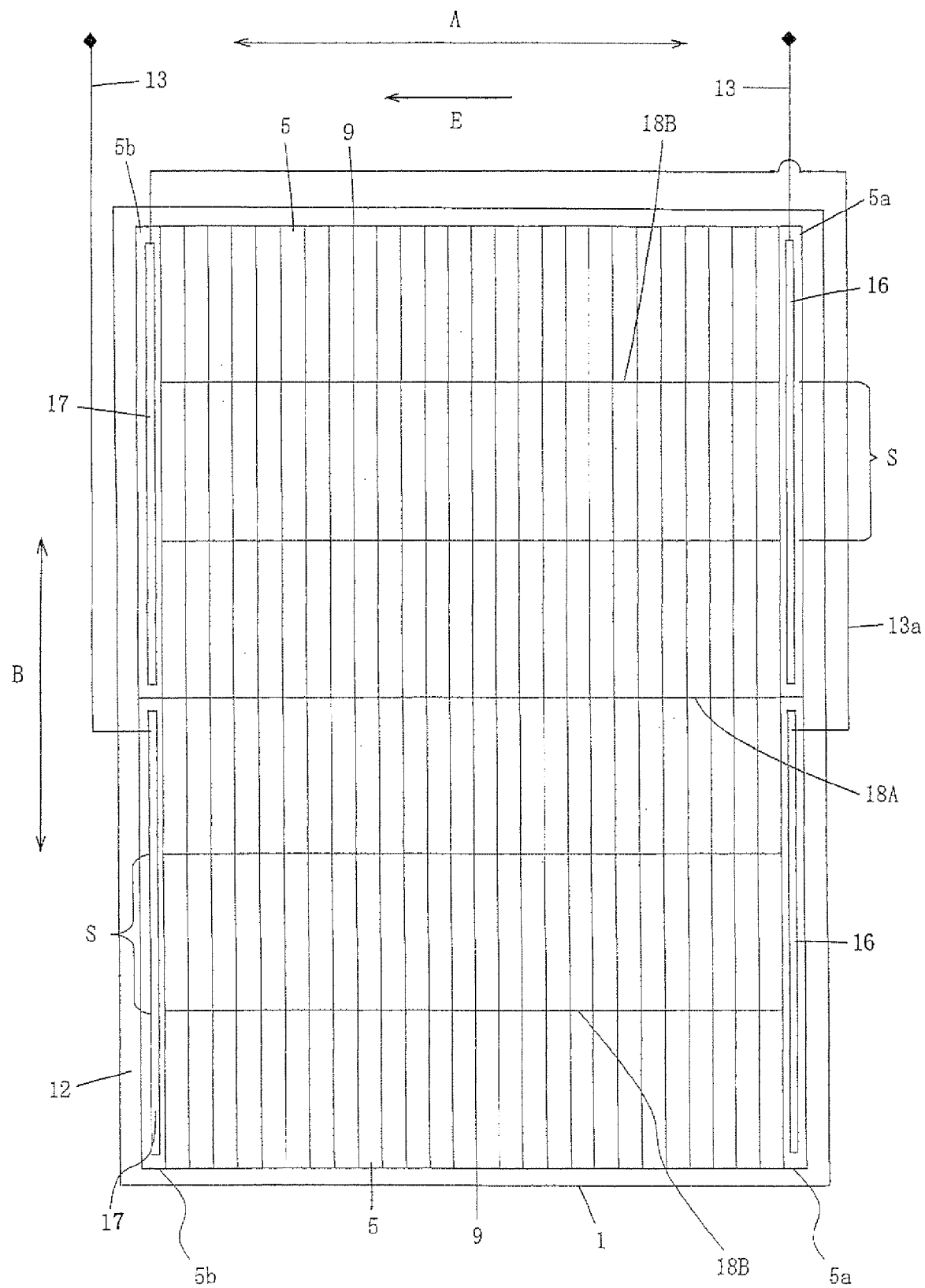
FIG. 3 is plan view illustrating the integrated thin-film solar battery according to an embodiment 2 of the present invention.

FIG. 3 is a plan view illustrating the integrated thin-film solar battery according to an embodiment 2 of the present invention. Components in FIG. 3 that are similar to those in FIGS. 1 and 2 are denoted by the same symbols.

In the solar battery according to the embodiment 2, a plurality of strings S are arranged in parallel on the one transparent insulating substrate 1 in the direction B perpendicular to the series-connecting direction. A across one or more string separating grooves that extend to the series-connecting direction. At least one string separating groove completely separates the plurality of strings S into groups. Further, the respective groups of the separated strings S are connected in parallel by a first power collecting electrode 16 and a second power collecting electrode 17, and the groups including the plurality of strings S connected in parallel are connected in series.

More concretely, in a case of the embodiment 2, the six strings S is formed on the one insulating substrate 1, and the first group including the adjacent three strings S and the second group including the other adjacent three strings are completely separated by one string separating groove 18A.

Further, the string separating groove 18B in each group does not completely separate the adjacent two strings S, and the cells 5a and 5b on both the ends of the series-connecting direction A in the three strings S in each group are integrated with each other. The first and second power collecting electrodes 16 and 17 are jointed onto the integrated cells 5a and 5b, respectively.

Therefore, the three strings S in each group are electrically connected in parallel, but the first group and the second group are not electrically connected in parallel.

In the solar battery having such a constitution, the first power collecting electrode 16 of the first group and the second power collecting electrode 17 of the second group are connected directly to each other or to a connecting line provided to a terminal box by an extraction line 13a so as to be electrically connected in series. The residual first and second power collecting electrodes 16 and 17 are electrically connected to an output line of the terminal box via the extraction line 13.

The embodiment 2 is effective for a constitution such that electric currents generated in the first group and the second group flow in the current direction E, and since the first group and the second group are connected in series, a high-voltage current can be output by one solar battery.

The other constitution and effect in the embodiment 2 are similar to those in the embodiment 1, and dropping of the first and second power collecting electrodes 6 and 7 is prevented.

Embodiment 3

Figure 4:
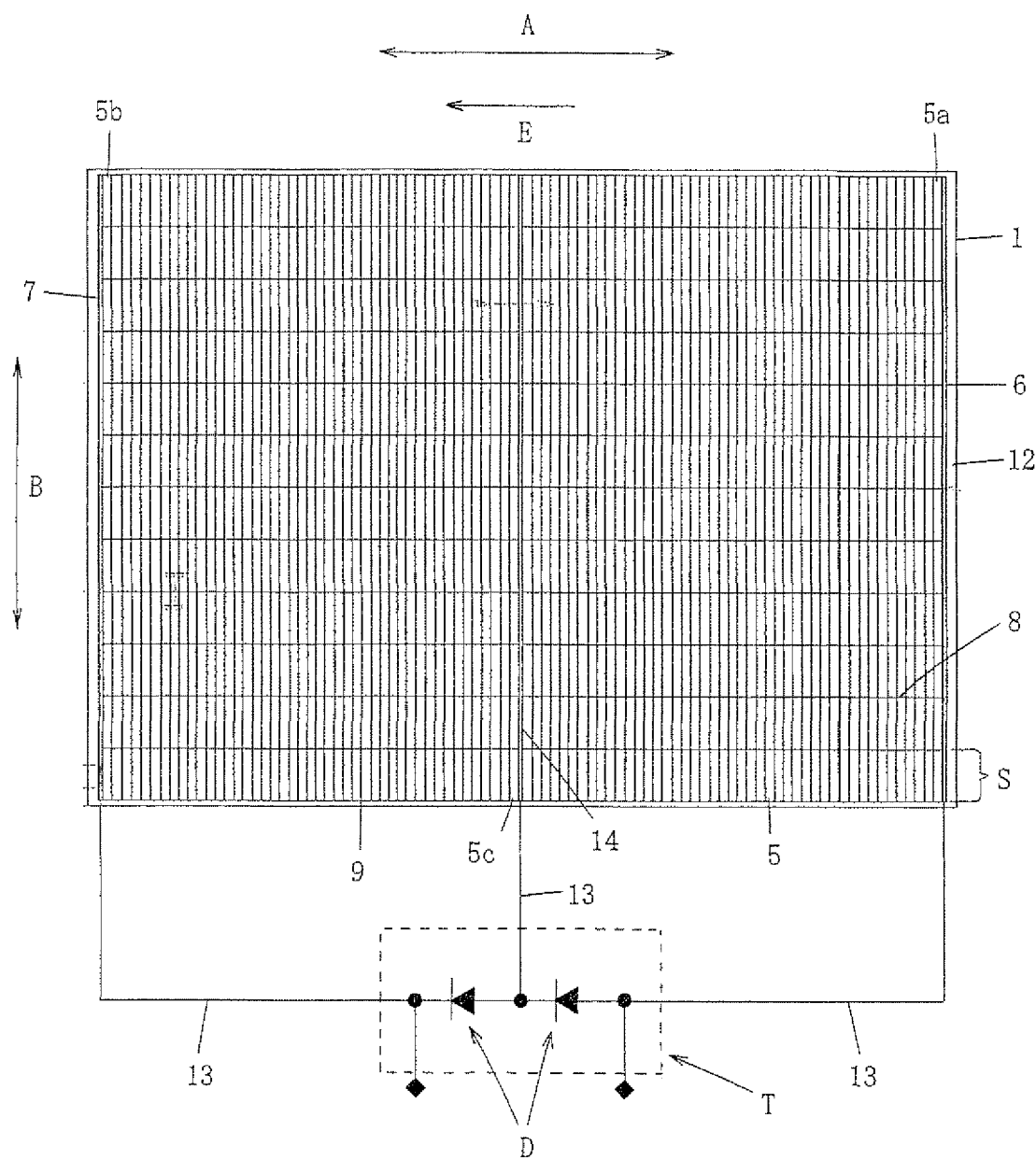
FIG. 4 is a plan view illustrating the integrated thin-film solar battery according to an embodiment 3 of the present invention.
Figure 5:
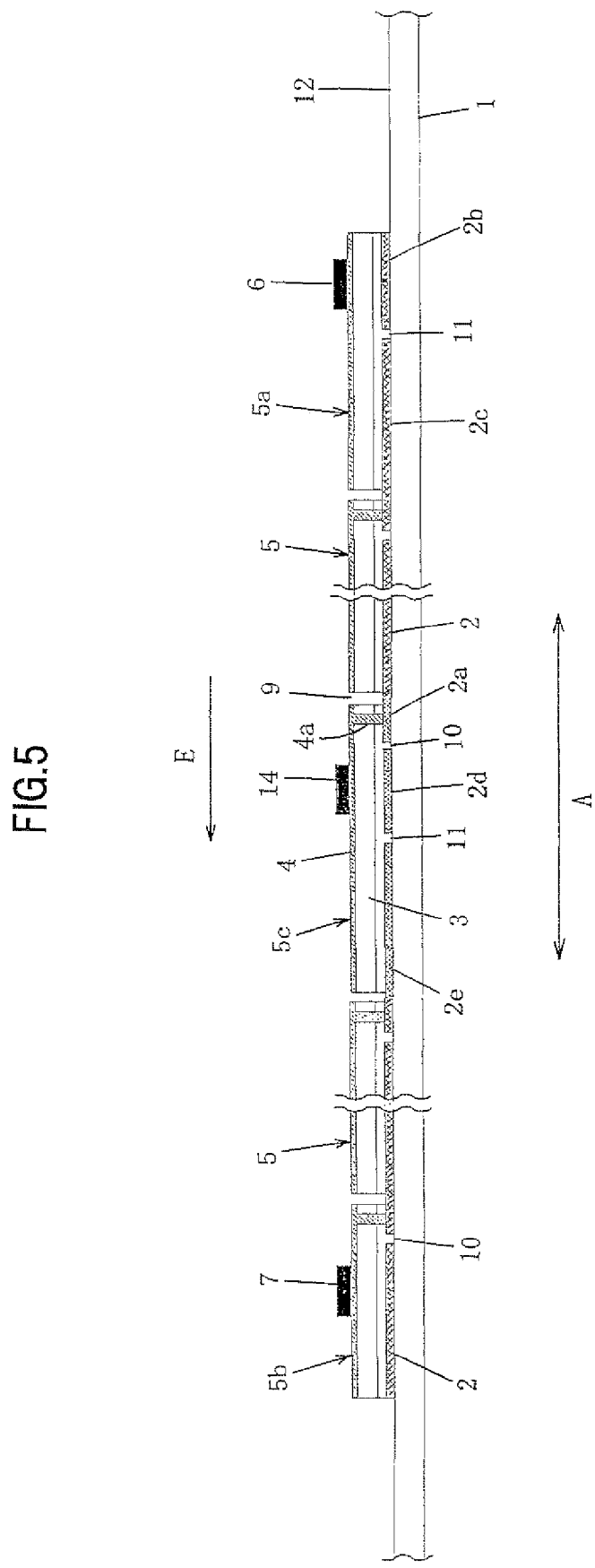
FIG. 5 is a cross-sectional where the integrated thin-film solar battery in FIG. 4 is cut along the series-connecting direction.
Figure 6:
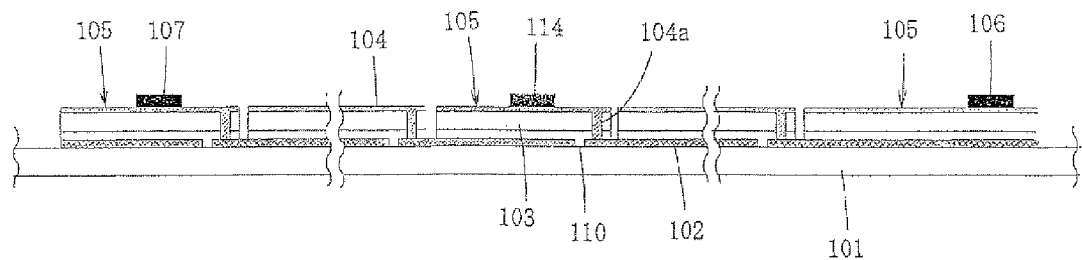
FIG. 6 is a partial cross-sectional view illustrating a conventional integrated thin-film solar battery.
Figure 7:
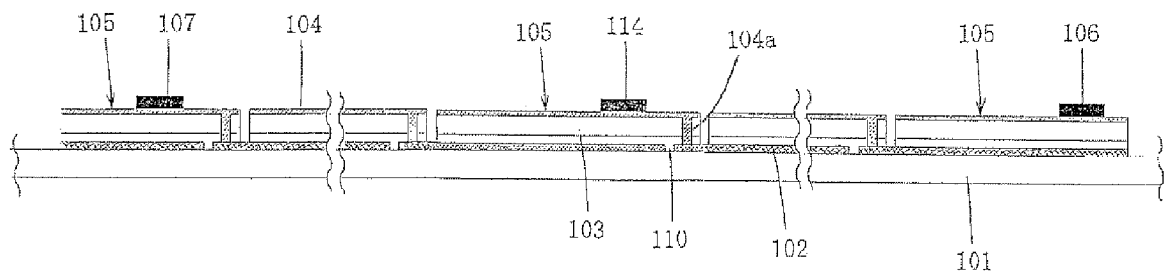
FIG. 7 is a partial cross-sectional view illustrating another conventional integrated thin-film solar battery.

FIG. 4 is a plan view illustrating the integrated thin-film solar battery according to an embodiment 3 of the present invention, and FIG. 5 is a cross-sectional view where the integrated thin-film solar battery in FIG. 4 is cut along the series-connecting direction. Components in FIGS. 4 and 5 that are similar to those in FIGS. 1 and 2 are denoted by the same symbols.

The embodiment 3 is different from the first embodiment in the following two points.

The first point is that an intermediate power collecting electrode 14 is formed on the second electrode layer 4 of one or more cells 5c between the cells 5a and 5b on the both ends having the first power collecting electrode 6 and the second power collecting electrode 7.

The second point is that a first electrode 2d just below and near the intermediate power collecting electrode 14 is insulated and separated from a first electrode layer 2e on the other portion by the insulating line 11 formed on the lower-stream side in the cell 5c having the intermediate power collecting electrode 14.

Concretely, in this solar battery, similarly to the embodiment 1, the twelve strings S are arranged in parallel on the one transparent insulating substrate 1 across the string separating grooves 8, and the first and second power collecting electrodes 6 and 7 are jointed onto the cells 5a and 5b of each string S on the upper-stream side and the lower-stream side in the current direction E so that the respective strings S are electrically connected in parallel.

Further, the one intermediate power collecting electrode 14 is jointed onto the cell 5c on an approximately middle position in each string S in the series-connecting direction A via a brazing filler metal (for example, silver paste).

Each cell 5c to be jointed to the intermediate power collecting electrode 14 is separated from each other by the string separating grooves 8 as shown in FIG. 2(c) but may be connected integrally as shown in FIG. 2(b).

Further, as shown in FIG. 5, in the cell 5c having the intermediate power collecting electrode 14, similarly to the embodiment 1, the electrode separating line 10 is arranged on the upper-stream side in the current direction E with respect to the portion just below the intermediate power collecting electrode 14, and the insulating line 11 is arranged on the lower-stream side with respect to the portion just below the intermediate power collecting electrode 14.

That is to say, the first electrode layer 2d just below the intermediate power collecting electrode 14 is insulated and separated from the first electrode layer 2 of the cell 5 on the upper-stream side by the separating line 10, and is insulated and separated from the first electrode layer 2e on the lower-stream side in the same cell 5c by the insulating line 11.

Therefore, the electric current from the cell 5 on the upper-stream side with respect to the cell 5c jointed to the intermediate power collecting electrode 14 partially flow to the intermediate power collecting electrode 14 via the conductive section 4a of the cell 5c and the second electrode layer 4, and partially flow to the first electrode layer 2e through the photoelectric conversion layer 3. The electric current does not flow to the first electrode layer 2d just below the intermediate power collecting electrode 14.

Therefore, even when a halfway short circuit occurs in the photoelectric conversion layer 3 just below the intermediate power collecting electrode 14 in the cell 5c, the electric current does not flow to a short-circuited portion. For this reason, a local heat generation on the short-circuited portion is prevented, thereby preventing dropping of the intermediate power collecting electrode 14, substrate cracking, film peeling, and an electrode damage, which are caused by the heat generation.

In the solar battery according to the embodiment 3 having such a constitution, as shown in FIG. 4, the plurality of strings S are electrically connected in parallel by the first power collecting electrode 6, the intermediate power collecting electrode 14 and the second power collecting electrode 7. A plurality of bypass diodes D provided into the terminal box T are electrically connected in parallel to the plurality of strings S electrically connected in parallel via the extraction line 13, and the plurality of bypass diodes D are electrically connected in series to each other.

Such a connection can provide the integrated thin-film solar battery that outputs a high-voltage while maintaining a hot spot resistance.

In the embodiment 3, the other part of this constitution is similar to that in the embodiment 1, and the solar battery can be manufactured according to the manufacturing method in the embodiment 1.

Another Embodiment

1. If trimming in the formation of the nonconductive surface region 12 (removal of the cell portion) is insufficient, the first electrode layer 2 of the cell 5b jointed to the second power collecting electrode 7 and the metal frame of the solar battery might be shorted. For this reason, in the solar battery having the constitution shown in FIG. 2 (embodiment 1), the insulating line is formed on the upper-stream side of the first electrode layer 2 of the cell 5b on the lowermost-stream side with respect to the second power collecting electrode 7. As a result, if the first electrode layer 2 of the cell 5b and the metal frame are shorted, the electric current from the solar battery can be prevented from flow to the metal frame.

2. The number of the strings, the attachment positions and the number of the power collecting electrodes are not limited to the above embodiments. For example, the intermediate power collecting electrode is left, and the first and second power collecting electrodes on the both ends in the series-connecting direction may be connected to the first electrode layer (p-side electrode, n-side electrode).

Further, the intermediate power collecting electrode may be provided to a plurality of places in the series-connecting direction of the strings.

Further, a number of string-forming regions on one transparent insulating substrate is four, and a group of the strings is formed on each region, and a plurality of groups may be connected into a desired form.

DESCRIPTION OF REFERENCE SYMBOLS

1: transparent insulating substrate
2, 2b 2c 2d, 2e: transparent first electrode layer
2a: extending section
3: photoelectric conversion layer
4: second electrode layer
4a: conductive section
5, 5a, 5b, 5c: thin-film photoelectric conversion element (cell)
6: first power collecting electrode
7: second power collecting electrode
8, 18A, 18B: string separating groove
9: element separating groove
10: electrode separating line
11: insulating line
14: intermediate power collecting electrode
A: series-connecting direction
B: direction perpendicular to the series-connecting direction
D: bypass diode
K: current direction
S: string

The invention claimed is:

1. An integrated thin-film solar battery, comprising:
a string that includes a plurality of thin-film photoelectric conversion elements formed on a transparent insulating substrate and electrically connected in series to each other; and
one or more power collecting electrodes electrically joined to the string, wherein
the thin-film photoelectric conversion elements have a first transparent electrode layer laminated on the transparent insulating substrate, a photoelectric conversion layer laminated on the first electrode layer, and a second electrode layer laminated on the photoelectric conversion layer,
the power collecting electrode is electrically joined onto the second electrode layer of any thin-film photoelectric conversion element in the string,
the string has an element separating groove formed by removing the second electrode layer and the photoelectric conversion layer between the adjacent two thin-film photoelectric elements,
the first electrode layer of one thin-film photoelectric conversion element has an extending section whose one end crosses the element separating groove and that extends to a region of another adjacent thin-film photoelectric conversion element, and is electrically insulated from the first electrode layer of the adjacent thin-film photoelectric conversion element by one or more electrode separating line,
the second electrode layer of the one thin-film photoelectric conversion element is electrically connected to the extending section of the first electrode layer of the adjacent thin-film photoelectric conversion element via a conductive section passing through the photoelectric conversion layer,
in the thin-film photoelectric conversion elements joined to the power collecting electrodes, at least a portion of the first electrode layer just below the power collecting electrodes and another portion of the first electrode layer disposed below the thin-film photoelectric conversion elements joined to the power collecting electrodes are insulated and separated from each other by at least one of the electrode separating line and an insulating line disposed below the thin-film photoelectric conversion elements joined to the power collecting electrodes,
wherein the power collecting electrode includes one or more intermediate power collecting electrodes, and the intermediate power collecting electrodes are joined onto the second electrode layer of one or more thin-film photoelectric conversion elements between the two thin-film photoelectric conversion elements on the both ends in the series-connecting direction in the string, the thin-film photoelectric conversion elements joined to the intermediate power collecting electrode have the electrode separating line at least on an upper-stream side of the first electrode layer in the current direction of electric currents flowing in the string with respect to a portion just below the intermediate power collecting electrode, and the insulating line on a lower-stream side of the first electrode layer in the current direction of the electric currents.

2. The integrated thin-film solar battery according to claim 1, wherein a plurality of the stings are arranged on the one transparent insulating substrate in a direction perpendicular to the series-connecting direction across one or more string separating grooves extending in the series-connecting direction, the plurality of strings are electrically connected in parallel or in series.

3. The integrated thin-film solar battery according to claim 1, wherein a plurality of the strings are arranged in parallel on the one transparent insulating substrate in a direction perpendicular to the series-connecting direction across one or more string separating grooves extending to the series-connecting direction, the plurality of strings are electrically connected in parallel by a first power collecting electrode, the intermediate power collecting electrode and a second power collecting electrode, a plurality of bypass diodes are electrically connected in parallel to the plurality of strings electrically connected in parallel, the plurality of bypass diodes are electrically connected in series.

4. The integrated thin-film solar battery according to claim 3, wherein in the plurality of strings, the plurality of thin-film photoelectric conversion elements that are positioned on the both ends of the series-connecting direction and are adjacent to each other in the direction perpendicular to the series-connecting direction are connected integrally without being separated by the string separating grooves.

5. The integrated thin-film solar battery according to claim 2, wherein the string separating groove includes a first groove formed by removing the first electrode layer, and a second groove formed by removing the photoelectric conversion layer and the second electrode layer by a width larger than a width of the first groove.

* * * * *